(12) United States Patent
Epstein

(10) Patent No.: US 11,664,804 B1
(45) Date of Patent: May 30, 2023

(54) XX COUPLER FOR PERSISTENT CURRENT QUBITS

(71) Applicant: Ryan J. Epstein, Denver, CO (US)

(72) Inventor: Ryan J. Epstein, Denver, CO (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 17/585,173

(22) Filed: Jan. 26, 2022

(51) Int. Cl.
| | |
|---|---|
| H03K 19/017 | (2006.01) |
| H03K 19/0175 | (2006.01) |
| H03K 19/195 | (2006.01) |
| H01L 39/24 | (2006.01) |
| H01L 39/22 | (2006.01) |
| H01L 27/18 | (2006.01) |

(52) U.S. Cl.
CPC ..... *H03K 19/017545* (2013.01); *H01L 27/18* (2013.01); *H01L 39/223* (2013.01); *H01L 39/2493* (2013.01); *H03K 19/1958* (2013.01)

(58) Field of Classification Search
CPC ............ H03K 19/017545; H01L 27/18; H01L 39/223

USPC ........................................................ 327/528
See application file for complete search history.

(56) References Cited

U.S. PATENT DOCUMENTS

| | | | | |
|---|---|---|---|---|
| 10,255,557 | B2 * | 4/2019 | Epstein | ................. G06N 10/00 |
| 10,650,323 | B2 * | 5/2020 | Epstein | ................. G06N 10/00 |

\* cited by examiner

*Primary Examiner* — Tomi Skibinski
(74) *Attorney, Agent, or Firm* — Tarolli, Sundheim, Covell & Tummino LLP

(57) ABSTRACT

Systems and methods are provided for coupling two qubits. A first persistent current qubit is fabricated with a first superconducting loop interrupted by a first Josephson junction isolated by a first inductor and a second inductor from a second Josephson junction. A second persistent current qubit is fabricated with a second superconducting loop interrupted by a third Josephson junction isolated by a third inductor and a fourth inductor from a fourth Josephson junction. Nodes defined by the Josephson junctions of the first qubit and their neighboring inductors are connected to corresponding nodes defined by the third Josephson junction and the third inductor via a first capacitor, with one pair of connections swapped such that the nodes are not connected to their respective corresponding nodes.

20 Claims, 4 Drawing Sheets

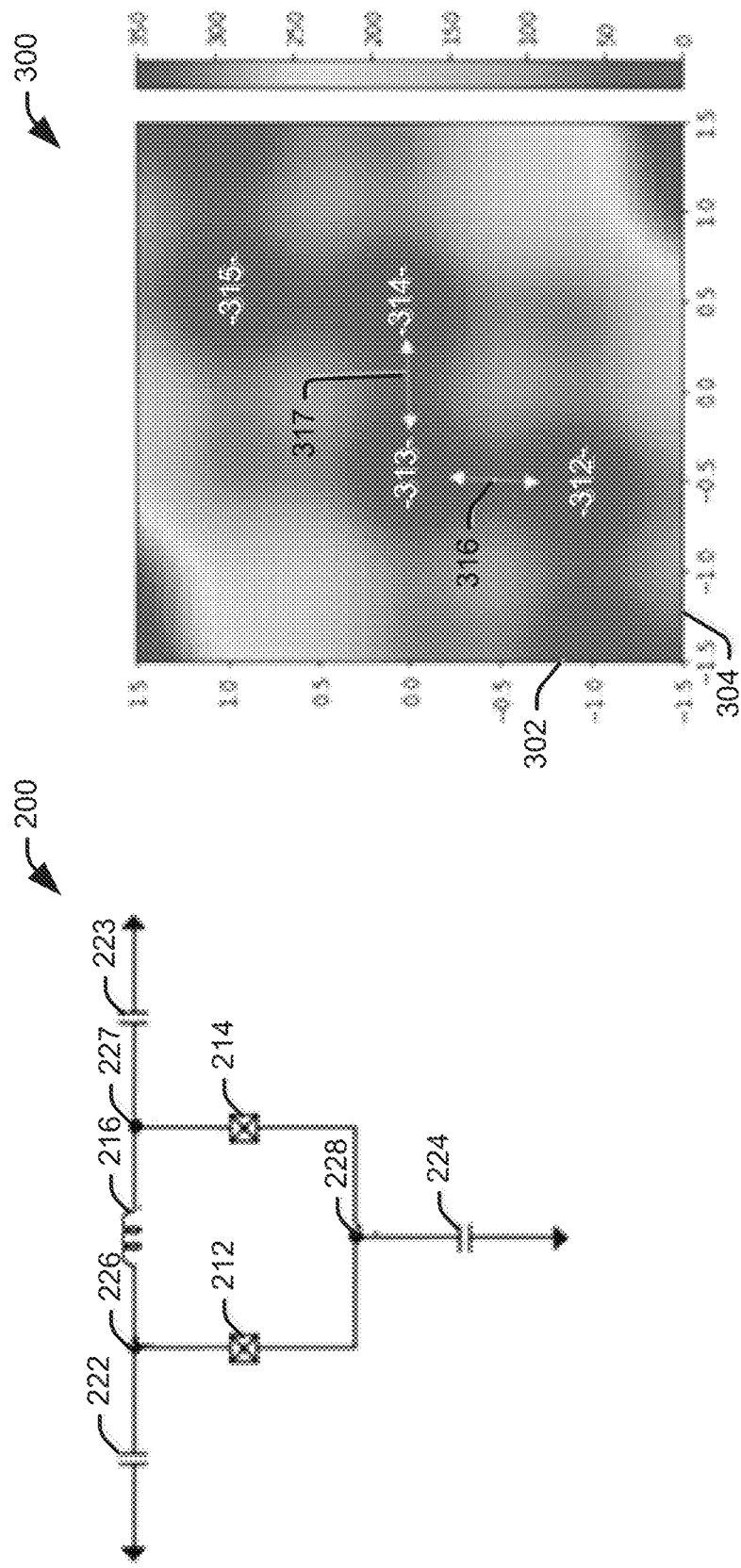

XX COUPLER FOR PERSISTENT CURRENT QUBITS

GOVERNMENT INTEREST

The invention was made under Government Contract. Therefore, the US Government has rights to the invention as specified in that contract.

TECHNICAL FIELD

This invention relates to quantum systems, and more particularly, to an XX coupler for persistent current qubits.

SUMMARY

In accordance with one example, a system includes a first persistent current qubit comprising a first superconducting loop interrupted by a first series of Josephson junctions. The first series of Josephson junctions begins with a first Josephson junction of the first series of Josephson junctions and continues in a first direction around the first superconducting loop. Each Josephson junction of the first series of Josephson junctions is isolated from neighboring Josephson junctions by two neighboring inductors of a first plurality of inductors and has a first associated circuit node between the Josephson junction and a first inductor of the two neighboring inductors of the first plurality of inductors in the first direction on the first superconducting loop and a second associated circuit node between the Josephson junction and a second inductor of the two neighboring inductors in a second direction, opposite to the first direction, on the first superconducting loop.

A second persistent current qubit includes a second superconducting loop interrupted by a second series of Josephson junctions. The second series of Josephson junctions begins with a first Josephson junction of the second series of Josephson junctions and continues in a first direction around the second superconducting loop. Each of the second series of Josephson junctions is isolated from neighboring Josephson junctions by two neighboring inductors of a second plurality of inductors and has a first associated circuit node between the Josephson junction and a first inductor of the two neighboring inductors of the second plurality of inductors in the first direction on the second superconducting loop and a second associated circuit node between the Josephson junction and a second inductor of the two neighboring inductors in a second direction, opposite to the first direction, on the second superconducting loop.

The system also includes a set of capacitive couplings between circuit nodes of the first persistent current qubit and the second persistent current qubit. A first capacitive coupling of the set of capacitive couplings connects the first circuit node associated with the first Josephson junction of the first series of Josephson junctions to the first circuit node associated with the first Josephson junction of the second series of Josephson junctions. A second capacitive coupling of the set of capacitive couplings connects the second circuit node associated with the first Josephson junction of the first series of Josephson junctions to the second circuit node associated with the first Josephson junction of the second series of Josephson junctions. A third capacitive coupling of the set of capacitive couplings connects the first circuit node associated with a second Josephson junction of the first series of Josephson junctions to the second circuit node associated with a second Josephson junction of the second series of Josephson junctions. A fourth capacitive coupling of the set of capacitive couplings connects the second circuit node associated with the second Josephson junction of the first series of Josephson junctions to the first circuit node associated with the second Josephson junction of the second series of Josephson junctions.

In accordance with another example, a method is provided. A first persistent current qubit is fabricated with a first superconducting loop interrupted by a first Josephson junction and a second Josephson junction. The first Josephson junction is isolated from the second Josephson junction by a first inductor and a second inductor. A second persistent current qubit is fabricated with a second superconducting loop interrupted by a third Josephson junction and a fourth Josephson junction. The third Josephson junction is isolated from the fourth Josephson junction by a third inductor and a fourth inductor. A first node defined by the first Josephson junction and the first inductor is connected to a second node defined by the third Josephson junction and the third inductor via a first capacitor. A third node defined by the first Josephson junction and the second inductor is connected to a fourth node defined by the third Josephson junction and the fourth inductor via a second capacitor. A fifth node defined by the second Josephson junction and the first inductor is connected to a sixth node defined by the fourth Josephson junction and the fourth inductor via a third capacitor. A seventh node defined by the second Josephson junction and the second inductor is connected to an eighth node defined by the fourth Josephson junction and the third inductor via a fourth capacitor.

In accordance with a further example, a system includes a first persistent current qubit includes a first superconducting loop interrupted by a first Josephson junction and a second Josephson junction. The first Josephson junction is isolated from the second Josephson junction by a first inductor and a second inductor. A second persistent current qubit includes a second superconducting loop interrupted by a third Josephson junction and a fourth Josephson junction. The third Josephson junction is isolated from the fourth Josephson junction by a third inductor and a fourth inductor. A first capacitive coupling connects a first node defined by the first Josephson junction and the first inductor to a second node defined by the third Josephson junction and the third inductor. A second capacitive coupling connects a third node defined by the first Josephson junction and the second inductor to a fourth node defined by the third Josephson junction and the fourth inductor. A third capacitive coupling connects a fifth node defined by the second Josephson junction and the first inductor to a sixth node defined by the fourth Josephson junction and the fourth inductor. A fourth capacitive coupling connects a seventh node defined by the second Josephson junction and the second inductor to an eighth node defined by the fourth Josephson junction and the third inductor. The first capacitive coupling, the second capacitive coupling, the third capacitive coupling, and the fourth capacitive coupling collectively provide an XX coupling between the first persistent current qubit and the second persistent current qubit.

BRIEF DESCRIPTION OF THE DRAWINGS

FIG. 2 is a circuit diagram illustrating a first Josephson junction isolated from a second Josephson junction by an inductor;

FIG. 3 is a heat map illustrating the energy of the system shown in FIG. 2 as a function of the Josephson phase across each of the first Josephson junction and the second Josephson junction;

DETAILED DESCRIPTION

As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

Systems and methods described herein provide XX coupling between two persistent current qubits. An XX coupling between two qubits is a coupling that makes it energetically favorable for the states of the first and second qubits to align in the same direction along the X-axis, both pointing either in the +X direction or both in the −X direction. Each axis corresponds to a specific quantum state defined on the Bloch sphere of the qubit. XX interactions have multiple uses including generating non-stoquastic Hamiltonians, generally in conjunction with ZZ and Z Hamiltonian terms that are used on quantum annealing machines and various quantum logic gates. A quantum circuit can be designed such that there is a non-zero probability that the state of a given qubit can change without the application of energy. In general, the Josephson junctions in a flux qubit loop create a potential with two or more minima and a barrier through which the multi-dimensional phase wave-function can tunnel. This systems and methods described herein exploit this barrier tunneling to provide an XX coupling between two qubits.

Figure 1:
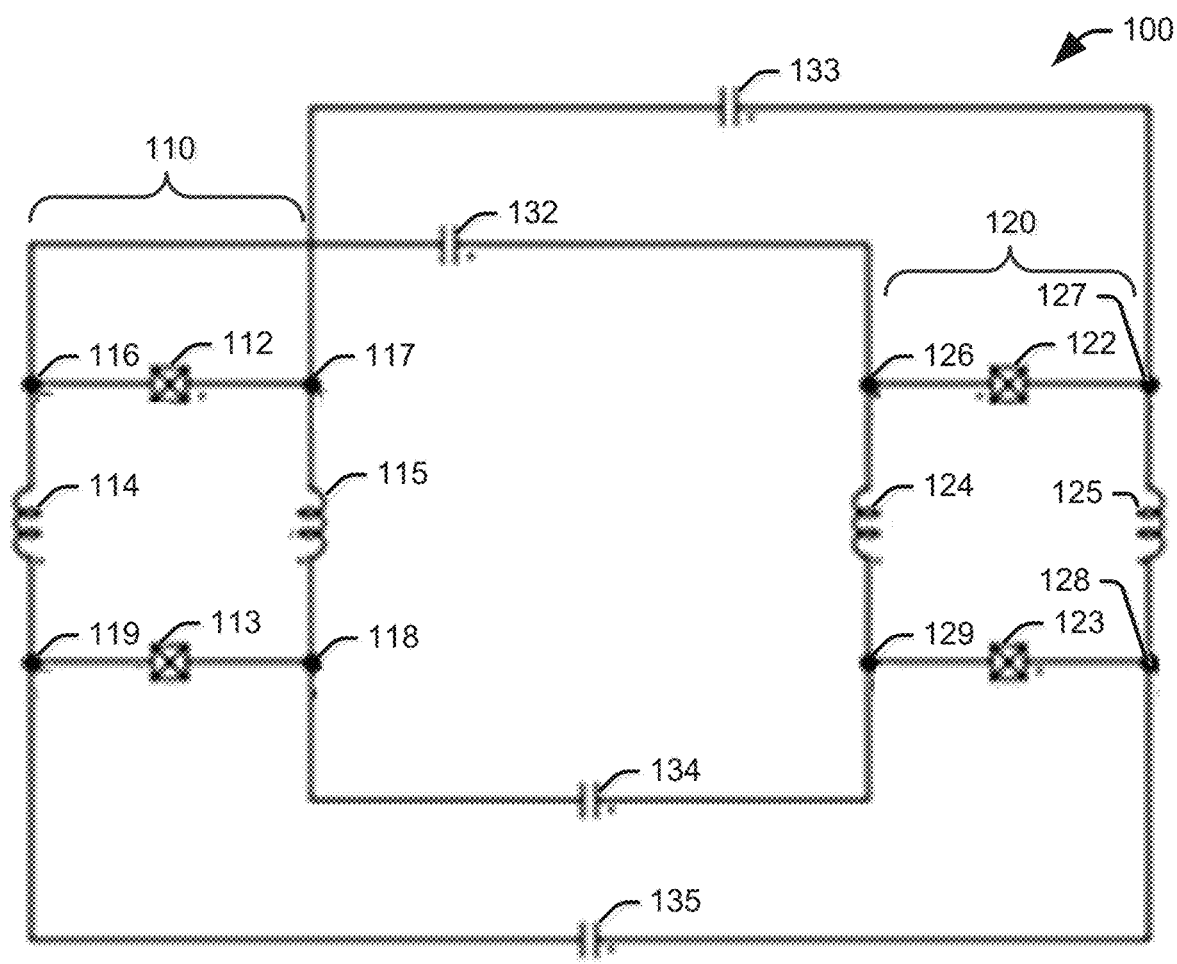
FIG. 1 illustrates one example of a quantum circuit providing an XX coupling between a first persistent current qubit and a second persistent current qubit.

FIG. 1 illustrates one example of a quantum circuit 100 providing an XX coupling between a first persistent current qubit 110 and a second persistent current qubit 120. In one example, each persistent current qubit 110 and 120 is implemented as a flux qubit. A flux qubit, in general terms, is a superconducting loop interrupted by some number of Josephson junctions. In general operation, a flux qubit is biased by a flux in units of the superconducting flux quantum (Do. When the applied bias flux is near one-half of a flux quantum and for suitable device parameters, the potential energy of the system exhibits two minima, one corresponding to clockwise and the other to counterclockwise current flow in the superconducting loop. The two possible directions of current flow represent the lowest energy quantum states of the system.

In the illustrated example, each persistent current qubit 110 and 120 comprises a superconducting loop 111 and 121 interrupted by a first Josephson junction 112 and 122 and a second Josephson junction 113 and 123. The Josephson junctions 112, 113, 122, and 123 in each loop are themselves separated by a first inductor 114 and 124 and a second inductor 115 and 125. Each inductor 114, 115, 124, and 125 is selected to have an inductance that is sufficiently large to isolate the tunneling of phase across the first junctions 114 and 124 from the second junction 115 and 125. The inductors 114, 115, 124, and 125 can be implemented, for example, using a Josephson junction chain, high kinetic inductance superconducting material, or long superconducting wires. In one implementation, each inductor 114, 115, 124, and 125 has an inductance between ten and one hundred nanohenries and each Josephson junction 112, 113, 122, and 123 has a critical current between twenty-five and one hundred nanoamps. The necessary inductance will vary with the critical current of the Josephson junctions 114, 115, 124 and 125, and in one example, an inductance of sixty nanohenries can be used for Josephson junctions having critical currents of around fifty nanoamps.

One example of the effects of the inductors 114, 115, 124, and 125 on the phase tunneling paths of the two Josephson junctions can be seen in FIGS. 2 and 3. FIG. 2 is a circuit diagram 200 illustrating a first Josephson junction 212 isolated from a second Josephson junction 214 by an inductor 216. The circuit is connected to ground through a set of capacitors 222-224 at each of a first node 226 between the first Josephson junction 212 and the inductor 216, a second node 227 between the second Josephson junction 214 and the inductor 216, a third node 228 between the first Josephson junction 212 and the second Josephson junction 214. In the illustrated example, each Josephson junction 212 and 214 has a critical current of fifty nanoamps, the inductor 216 has an inductance of eighty nanohenries, and each capacitor 222-224 has a capacitance of one-tenth of a femtofarad.

FIG. 3 is a heat map 300 illustrating the energy of the system shown in FIG. 2 as a function of the Josephson phase across each of the first Josephson junction 212 and the second Josephson junction 214. The phase across the first Josephson junction 212 is shown on the vertical axis 302 in units of radians normalized by dividing by $2\pi$. The phase across the second Josephson junction 214 is shown on the horizontal axis 304 in units of radians normalized by dividing by $2\pi$. The chart 300 shows a plurality of energy minima 312-315, with first and second energy minima 312 and 313 representing a first computational state of the system and third and fourth energy minima 314 and 315 representing a second computational state of the system. Tunneling paths 316 and 317 represent transitions between computational states of the system without raising the energy of the system above an energy of the barrier separating the minima 312-315. As can be seen in the heat map 300, the tunneling paths are nearly orthogonal, due to the high degree of isolation provided by the inductor 216. This allows the tunneling paths to be substantially independent of one another.

Returning to FIG. 1, each qubit 110 and 120 can be described in terms of four circuit nodes, a first node 116 and 126 between the first Josephson junction 112 and 122 and the first inductor 114 and 124, a second node 117 and 127 between the first Josephson junction 112 and 122 and the second inductor 115 and 125, a third node 118 and 128 between the second Josephson junction 113 and 123 and the second inductor 115 and 125, and a fourth node 119 and 129 between the second Josephson junction 113 and 123 and the first inductor 114 and 124. In the illustrated implementation, each node 116-119 of the first qubit 110 is connected to a selected node 126-129 of the second qubit 120 via respective capacitors 132-135. In one implementation, capacitor 132-135 has a capacitance between fifty femtofarads and two hundred femtofarads. In the illustrated example, each capacitor 132-135 has a capacitance of one hundred fifty femtofarads. In the illustrated example, each of the first nodes 116 and 126 and the second nodes 117 and 127 are connected to their corresponding node, but the third node 118 and 128 of each qubit is connected to the fourth node 119 and 129 of the other qubit. While the XX coupling would be present with each node 116-119 of the first qubit 110 connected to their corresponding node 126-129 of the second qubit 120, by reversing the order of the connection for the nodes associated with one of the Josephson junctions, ZZ coupling and single qubit effects from the coupling can be avoided. In one implementation, the XX coupling has a coupling strength between five hundred megahertz and two gigahertz.

The connections through the plurality of capacitors 132-135 creates a plurality of tunneling paths between the potential minima associated with the multiple states of the first and second flux qubits, such that a tunneling path between pairs of ground states having equal bit parity are created. In other words, the XX coupler allows the system formed by the two qubits to tunnel between the states $|00\rangle$ and $|11\rangle$ as well as between the states $|01\rangle$ and $|10\rangle$. Effectively, a first tunneling path creates a first interaction $g_1(|01\rangle\langle 10|+|10\rangle\langle 01|)$, where $g_1$ is the strength, or tunneling energy of the first interaction, and a second tunneling path creates a second interaction $g_2(|00\rangle\langle 11|+|11\rangle\langle 00|)$, where $g_2$ is the strength of the second interaction. The interaction strength, $g_i$, for a given tunneling path depends on the height of the tunneling barrier between the two states is and is equal to half the energy splitting between the ground states and excited states of the coupling term. The sum of the two interactions is the XX interaction as written in the standard, or Z, basis. In the illustrated example, a coupling energy of around 0.95 gigahertz is provided.

Figure 4:
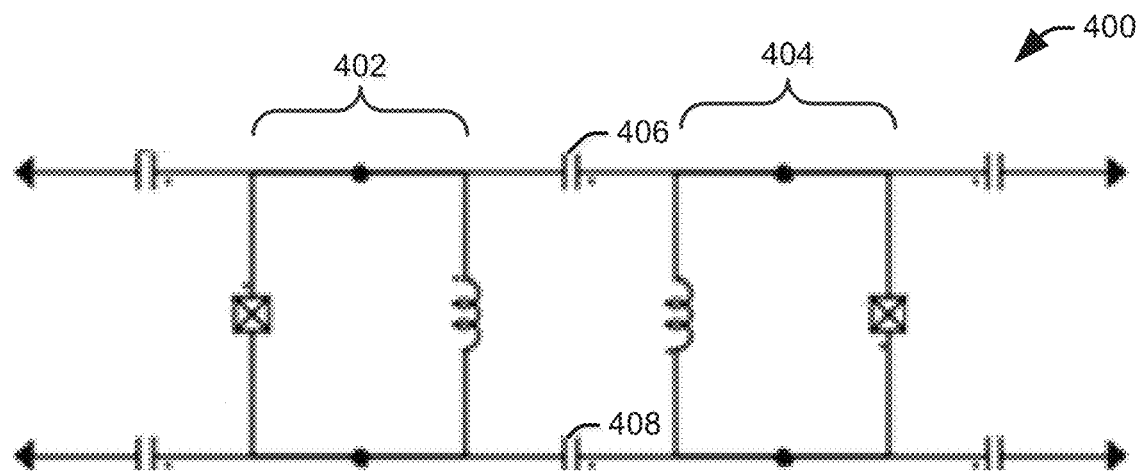
FIG. 4 is a circuit diagram illustrating a first flux qubit connected to a second flux qubit via a first capacitor and a second capacitor.

The effects of the capacitors on the phase tunneling paths of the two Josephson junctions can be seen in FIG. 4. FIG. 4 is a circuit diagram 400 illustrating a first flux qubit 402 connected to a second flux qubit 404 via a first capacitor 406 and a second capacitor 408. In the illustrated example, the first and second capacitors 406 and 408 have a capacitance of one hundred fifty femtofarads, the inductors in each flux qubit 402 and 404 have an inductance of fifty nanohenries, and a critical current of each Josephson junction is fifty nanoamps. By capacitively coupling the two qubits 402 and 404 in this manner, the direction that wave functions spread in a multi-dimensional phase space defined by the Josephson junctions associated with the qubits 402 and 404 can be controlled, allowing wave functions associated with specific potential minima to be coupled selectively. In this instance, the states $|00\rangle$ and $|11\rangle$ are coupled to provide a ground state of $$\frac{|00\rangle + |11\rangle}{\sqrt{2}},$$

as well as degenerate excited states of $|01\rangle$ and $|10\rangle$ about 1.08 gigahertz above ground, and another excited state of $$\frac{|00\rangle - |11\rangle}{\sqrt{2}}$$

about 1.85 gigahertz above ground. It will be appreciated that the direction of the spread of the wave function in phase space, and thus the specific coupling of the wave functions associated with the energy minima, can be controlled via selection of the capacitance of the capacitors 406 and 408.

An advantage of the proposed XX coupler is that it can provide an XX interaction without coupling the qubits along other axes of the Bloch sphere or introducing single qubit effects, such as single qubit tunneling. The coupler Josephson junctions may have slightly different critical currents due to fabrication variation, and in some examples, one or more junctions can be replaced with tunable junctions, such as compound junctions. Further, the proposed coupler can be used for qubits having degenerate energy states, that is, energy states having the same energy. Flux qubits and fluxonium qubits are examples of a qubit that can be operated with degenerate ground states. Finally, the coupler can be fabricated with as few as two loops, limiting the effects of environmental noise on the system 100.

Figure 5:
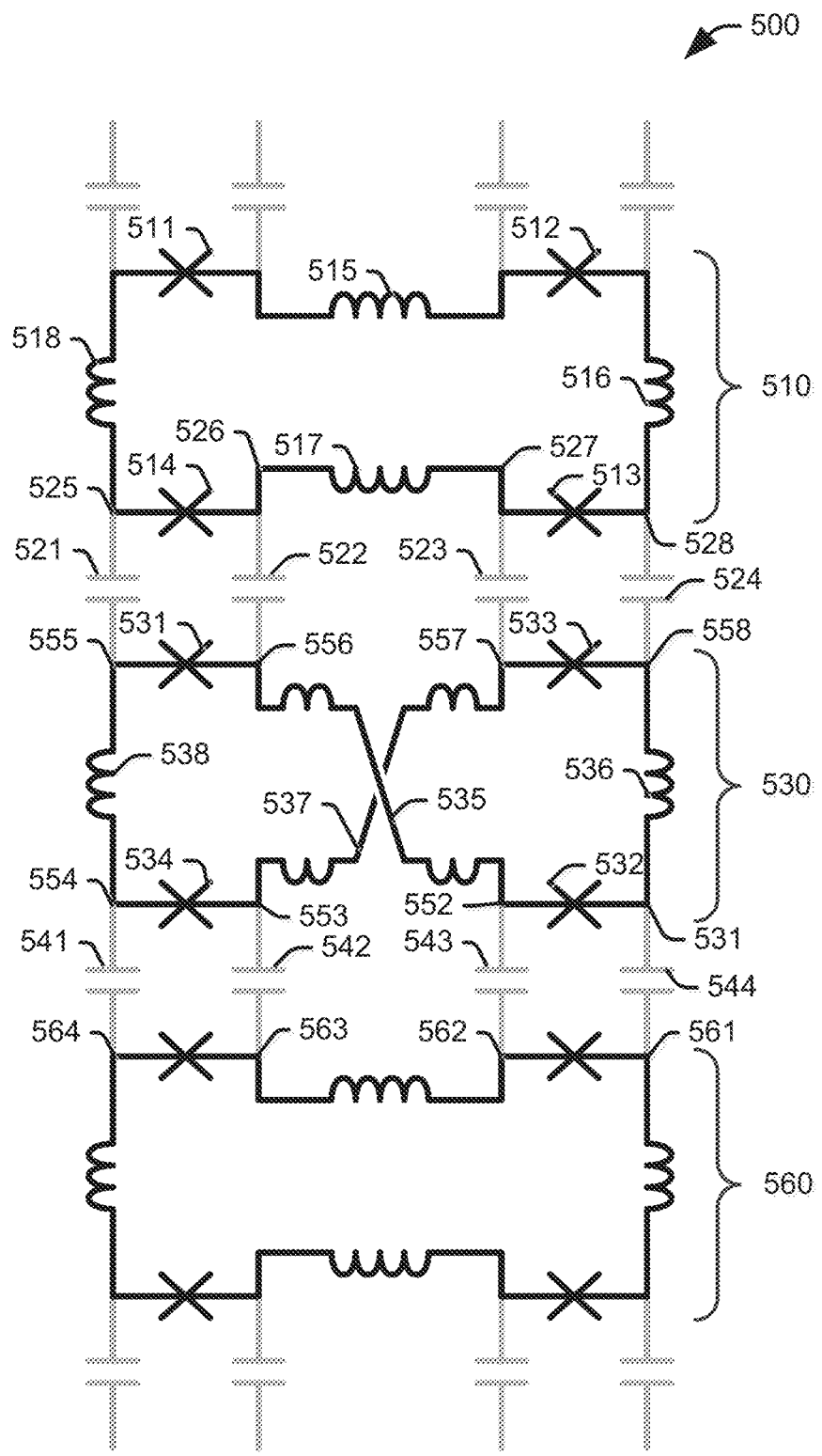
FIG. 5 illustrates one implementation of a quantum system in which a series of persistent current qubits can be chained together to provide XX coupling across an array of qubits.

FIG. 5 illustrates one implementation of a quantum system 500 in which a series of persistent current qubits 510, 530, and 560 can be chained together to provide XX coupling across an array of qubits. In the illustrated implementation, each qubit (e.g., 510 and 530) is constructed as a set of four Josephson junctions 511-514 and 531-534 and isolated from one another via inductors 515-518 and 535-538. Each of the qubits (e.g., 530) is connected to one or more neighboring qubits (e.g., 510 and 560) by respective sets of capacitors 521-524 and 541-544. Each connection between qubits originates from a first circuit node 551-558 between an inductor and a Josephson junction on one qubit (e.g., 530) and terminates at a second circuit node 525-528 and 561-564 between a selected inductor and Josephson junction on another qubit (e.g., 510 and 560).

As described in FIG. 1, it is desirable to connect the qubits such that the connections across a first Josephson junction in a given qubit are made to corresponding positions in the connected qubit, but the connections to the connected qubit across a second Josephson junction in the given qubit are reversed relative to those of the first Josephson junction. To simplify fabrication of the connections, every other qubit, in this case, qubit 503, can be fabricated such that the shape of superconducting loop is altered, allowing Josephson junction in the same physical position across qubits 502 and 503 to be connected differently. For example, the superconducting loops can be substantially planar within a defined plane, with the projection of the superconducting loops associated with some qubits (e.g., 510 and 560) into the defined plane comprising a single closed loop, and a projection of the superconducting loop associated with other qubits (e.g., 530) into the defined plane comprising two connected loops. As a result, the qubits 510, 530, and 560) can be connected in a standardized manner while still maintaining the reversed or staggered connection described in FIG. 1.

Figure 6:
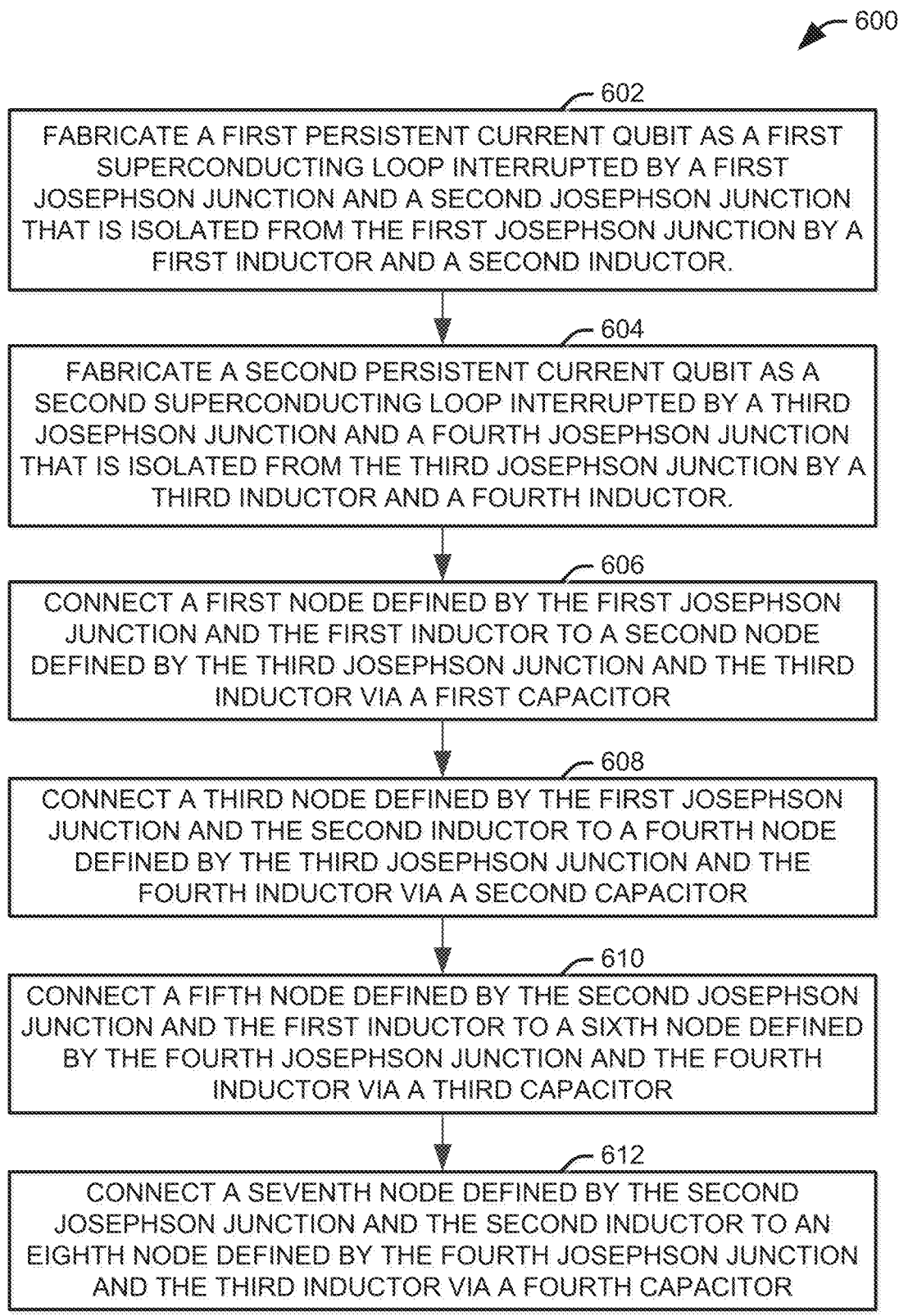
FIG. 6 illustrates a method for fabricating a quantum system having an XX coupling between two persistent current qubits.

In view of the foregoing structural and functional features described above, example methods will be better appreciated with reference to FIG. 6. While, for purposes of simplicity of explanation, the example methods of FIG. 6 are shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 6 illustrates a method 600 for fabricating a quantum system having an XX coupling between two persistent current qubits, such as flux qubits. At 602, a first persistent current qubit is fabricated. The first persistent qubit includes a first superconducting loop interrupted by a first Josephson junction and a second Josephson junction. The first Josephson junction is isolated from the second Josephson junction by a first inductor and a second inductor. The inductors can be fabricated, for example, as a Josephson junction chain, from high kinetic inductance superconducting material, or as long superconducting wires. In one example, each Josephson junction has an inductance between ten and one hundred nanohenries, and each Josephson junction can have a critical current between twenty-five and one hundred nanoamps.

At 604, a second persistent current qubit is fabricated. The second persistent current qubit includes a second superconducting loop interrupted by a third Josephson junction and a fourth Josephson junction. The third Josephson junction is isolated from the fourth Josephson junction by a third inductor and a fourth inductor. The inductors can be fabricated, for example, as a Josephson junction chain, from high kinetic inductance superconducting material, or as long superconducting wires. In one example, each Josephson junction has an inductance between ten and one hundred nanohenries, and each Josephson junction can have a critical current between twenty-five and one hundred nanoamps. In one example, each of the first superconducting loop and the second superconducting loop are substantially planar within a defined plane, a projection of the first superconducting loop into the defined plane comprising a single closed loop, and a projection of the second superconducting loop into the defined plane comprising two connected loops.

At 606, a first node defined by the first Josephson junction and the first inductor is connected to a second node defined by the third Josephson junction and the third inductor via a first capacitor. At 608, a third node defined by the first Josephson junction and the second inductor is connected to a fourth node defined by the third Josephson junction and the fourth inductor via a second capacitor. At 610, a fifth node defined by the second Josephson junction and the first inductor is connected to a sixth node defined by the fourth Josephson junction and the fourth inductor via a third capacitor. At 612, a seventh node defined by the second Josephson junction and the second inductor is connected to an eighth node defined by the fourth Josephson junction and the third inductor via a fourth capacitor. In one example, each of the first capacitor, the second capacitor, the third capacitor, and the fourth capacitor has a capacitance between fifty femtofarads and two hundred femtofarads. The capacitive connections between the nodes from 606, 608, 610, and 612 collectively provide an XX coupling between the first persistent current qubit and the second persistent current qubit. In one example, the XX coupling has a coupling strength between five hundred megahertz and two gigahertz.

In the preceding description, specific details have been set forth in order to provide a thorough understanding of example implementations of the invention described in the disclosure. However, it will be apparent that various implementations may be practiced without these specific details. For example, circuits, systems, networks, processes, and other components may be shown as components in block diagram form in order not to obscure the example implementations in unnecessary detail. In other instances, well-known circuits, processes, algorithms, structures, and techniques may be shown without unnecessary detail in order to avoid obscuring the examples. The description of the example implementations will provide those skilled in the art with an enabling description for implementing an example of the invention, but it should be understood that various changes may be made in the function and arrangement of elements without departing from the spirit and scope of the invention. Accordingly, the present invention is intended to embrace all such alterations, modifications, and variations that fall within the scope of the appended claims.

What is claimed is:

1. A system comprising:
a first persistent current qubit comprising a first superconducting loop interrupted by a first series of Josephson junctions, the first series of Josephson junctions beginning with a first Josephson junction of the first series of Josephson junctions and continuing in a first direction around the first superconducting loop, each Josephson junction of the first series of Josephson junctions being isolated from neighboring Josephson junctions by two neighboring inductors of a first plurality of inductors and having a first associated circuit node between the Josephson junction and a first inductor of the two neighboring inductors of the first plurality of inductors in the first direction on the first superconducting loop and a second associated circuit node between the Josephson junction and a second inductor of the two neighboring inductors in a second direction, opposite to the first direction, on the first superconducting loop;
a second persistent current qubit comprising a second superconducting loop interrupted by a second series of Josephson junctions, the second series of Josephson junctions beginning with a first Josephson junction of the second series of Josephson junctions and continuing in a first direction around the second superconducting loop, each of the second series of Josephson junctions being isolated from neighboring Josephson junctions by two neighboring inductors of a second plurality of inductors, and having a first associated circuit node between the Josephson junction and a first inductor of the two neighboring inductors of the second plurality of inductors in the first direction on the second superconducting loop and a second associated circuit node between the Josephson junction and a second inductor of the two neighboring inductors in a second direction, opposite to the first direction, on the second superconducting loop;
a set of capacitive couplings between circuit nodes of the first persistent current qubit and the second persistent current qubit, a first capacitive coupling of the set of capacitive couplings connecting the first circuit node associated with the first Josephson junction of the first series of Josephson junctions to the first circuit node associated with the first Josephson junction of the second series of Josephson junctions, a second capacitive coupling of the set of capacitive couplings connecting the second circuit node associated with the first Josephson junction of the first series of Josephson junctions to the second circuit node associated with the first Josephson junction of the second series of Josephson junctions, a third capacitive coupling of the set of capacitive couplings connecting the first circuit node associated with a second Josephson junction of the first series of Josephson junctions to the second circuit node associated with a second Josephson junction of the second series of Josephson junctions, and a fourth capacitive coupling of the set of capacitive couplings connecting the second circuit node associated with the second Josephson junction of the first series of Josephson junctions to the first circuit node associated with the second Josephson junction of the second series of Josephson junctions.

2. The system of claim 1, further comprising a third persistent current qubit comprising a third superconducting loop interrupted by a third series of Josephson junctions, the third series of Josephson junctions beginning with a first Josephson junction of the third series of Josephson junctions and continuing in a first direction around the third superconducting loop, each Josephson junction of the third series of Josephson junctions being isolated from neighboring Josephson junctions by an inductor of a third plurality of inductors and having a first associated circuit node between the Josephson junction and a first inductor of the two neighboring inductors in the first direction on the superconducting loop, and a second associated circuit node between the Josephson junction and a second inductor of the two neighboring inductors in a second direction, opposite to the first direction, on the third superconducting loop, the set of capacitive couplings further comprising a fifth capacitive coupling of the set of capacitive couplings connecting the first circuit node associated with a second Josephson junction of the third series of Josephson junctions to the first circuit node associated with a third Josephson junction of the second series of Josephson junctions, and a sixth capacitive coupling of the set of capacitive couplings connecting the second circuit node associated with the second Josephson junction of the third series of Josephson junctions to the second circuit node associated with the third Josephson junction of the second series of Josephson junctions, a seventh capacitive coupling of the set of capacitive couplings connecting the first circuit node associated with the first Josephson junction of the third series of Josephson junctions to the second circuit node associated with a fourth Josephson junction of the second series of Josephson junctions, and an eighth capacitive coupling of the set of capacitive couplings connecting the second circuit node associated with the first Josephson junction of the third series of Josephson junctions to the first circuit node associated with the fourth Josephson junction of the second series of Josephson junctions.

3. The system of claim 1, wherein each of the first superconducting loop and the second superconducting loop are substantially planar within a defined plane, a projection of the first superconducting loop into the defined plane comprising a single closed loop, and a projection of the second superconducting loop into the defined plane comprising two connected loops.

4. The system of claim 1, wherein each of the set of capacitive couplings has a capacitance between ten femtofarads and two hundred femtofarads.

5. The system of claim 1, wherein each inductor of the first plurality of inductors and the second plurality of inductors has an inductance between one and one hundred nanohenries.

6. The system of claim 1, wherein the set of capacitive couplings provide an XX coupling between the first persistent current qubit and the second persistent current qubit.

7. The system of claim 6, wherein the XX coupling has a coupling strength between five hundred megahertz and ten gigahertz.

8. The system of claim 1, wherein each inductor of the first plurality of inductors and the second plurality of inductors is implemented using one of a Josephson junction chain, high kinetic inductance superconducting material, and long superconducting wires.

9. The system of claim 1, wherein each of the first persistent current qubit and the second persistent current qubit are flux qubits.

10. The system of claim 1, wherein each of the first series of Josephson junctions and the second series of Josephson junctions has a critical current between twenty-five and five hundred nanoamps.

11. A method comprising:
fabricating a first persistent current qubit comprising a first superconducting loop interrupted by a first Josephson junction and a second Josephson junction, the first Josephson junction being isolated from the second Josephson junction by a first inductor and a second inductor;
fabricating a second persistent current qubit comprising a second superconducting loop interrupted by a third Josephson junction and a fourth Josephson junction, the third Josephson junction being isolated from the fourth Josephson junction by a third inductor and a fourth inductor;
connecting a first node defined by the first Josephson junction and the first inductor to a second node defined by the third Josephson junction and the third inductor via a first capacitor;
connecting a third node defined by the first Josephson junction and the second inductor to a fourth node defined by the third Josephson junction and the fourth inductor via a second capacitor;
connecting a fifth node defined by the second Josephson junction and the first inductor to a sixth node defined by the fourth Josephson junction and the fourth inductor via a third capacitor; and
connecting a seventh node defined by the second Josephson junction and the second inductor to an eighth node defined by the fourth Josephson junction and the third inductor via a fourth capacitor.

12. The method of claim 11, wherein each of the first superconducting loop and the second superconducting loop are substantially planar within a defined plane, a projection of the first superconducting loop into the defined plane comprising a single closed loop, and a projection of the second superconducting loop into the defined plane comprising two connected loops.

13. The method of claim 11, wherein each of the first capacitor, the second capacitor, the third capacitor, and the fourth capacitor has a capacitance between ten femtofarads and two hundred femtofarads.

14. The method of claim 11, wherein each of the first inductor, the second inductor, the third inductor, the fourth inductor has an inductance between one and one hundred nanohenries.

15. The method of claim 11, wherein the set of capacitive couplings provide an XX coupling between the first persistent current qubit and the second persistent current qubit.

16. The method of claim 11, wherein each inductor of the first plurality of inductors and the second plurality of inductors is fabricated as one of a Josephson junction chain, high kinetic inductance superconducting material, and long superconducting wires.

17. The method of claim 11, wherein each of the first persistent current qubit and the second persistent current qubit are flux qubits.

18. The system of claim 11, wherein each of the first Josephson junction, the second Josephson junction, the third Josephson junction, and the fourth Josephson junction has a critical current between twenty-five and five hundred nanoamps.

19. A system comprising:
a first persistent current qubit comprising a first superconducting loop interrupted by a first Josephson junction and a second Josephson junction, the first Josephson junction being isolated from the second Josephson junction by a first inductor and a second inductor;

a second persistent current qubit comprising a second superconducting loop interrupted by a third Josephson junction and a fourth Josephson junction, the third Josephson junction being isolated from the fourth Josephson junction by a third inductor and a fourth inductor;

a first capacitive coupling connecting a first node defined by the first Josephson junction and the first inductor to a second node defined by the third Josephson junction and the third inductor;

a second capacitive coupling connecting a third node defined by the first Josephson junction and the second inductor to a fourth node defined by the third Josephson junction and the fourth inductor;

a third capacitive coupling connecting a fifth node defined by the second Josephson junction and the first inductor to a sixth node defined by the fourth Josephson junction and the fourth inductor; and a fourth capacitive coupling connecting a seventh node defined by the second Josephson junction and the second inductor to an eighth node defined by the fourth Josephson junction and the third inductor;

wherein the first capacitive coupling, the second capacitive coupling, the third capacitive coupling, and the fourth capacitive coupling collectively provide an XX coupling between the first persistent current qubit and the second persistent current qubit.

20. The system of claim 19, wherein the XX coupling has a coupling strength between five hundred megahertz and ten gigahertz.

\* \* \* \* \*